(12) United States Patent
Doan

(10) Patent No.: US 6,271,561 B2
(45) Date of Patent: *Aug. 7, 2001

(54) METHOD FOR FABRICATING FLOATING GATE SEMICONDUCTOR DEVICES WITH TRENCH ISOLATION STRUCTURES AND SELF ALIGNED FLOATING GATES

(75) Inventor: Trung Tri Doan, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/536,928

(22) Filed: Mar. 27, 2000

Related U.S. Application Data

(60) Division of application No. 09/148,845, filed on Sep. 4, 1998, which is a continuation-in-part of application No. 08/909,713, filed on Aug. 12, 1997, now Pat. No. 6,054,733, which is a division of application No. 08/532,997, filed on Sep. 25, 1995, now Pat. No. 5,767,005, which is a continuation-in-part of application No. 08/098,449, filed on Jul. 27, 1993, now abandoned.

(51) Int. Cl.[7] .................................................. H01L 29/788
(52) U.S. Cl. ........................................... 257/316; 257/510
(58) Field of Search .................................... 257/315, 316, 257/317–323, 510; 438/257–267, 593–594

(56) References Cited

U.S. PATENT DOCUMENTS

| | | |
|---|---|---|
| 4,818,725 | 4/1989 | Lichtel, Jr. et al. . |
| 4,833,094 | 5/1989 | Kenny . |
| 4,997,781 | * 3/1991 | Tigelaar . |
| 5,032,881 | 7/1991 | Sardo et al. . |
| 5,047,362 | 9/1991 | Bergemont . |
| 5,235,200 | 8/1993 | Komori et al. . |
| 5,270,234 | 12/1993 | Huang et al. . |
| 5,290,721 | 3/1994 | Yoshimi et al. . |
| 5,292,673 | 3/1994 | Shinriki et al. . |
| 5,451,803 | 9/1995 | Oji et al. . |
| 5,616,513 | 4/1997 | Shepard . |
| 5,705,415 | 1/1998 | Orlowski et al. . |
| 5,712,179 | 1/1998 | Yuan . |
| 5,729,043 | 3/1998 | Shepard . |
| 5,733,383 | 3/1998 | Fazan et al. . |
| 5,741,740 | 4/1998 | Jang et al. . |
| 5,753,561 | 5/1998 | Lee et al. . |
| 5,763,309 | 6/1998 | Chang . |
| 5,763,315 | 6/1998 | Benedict et al. . |
| 5,763,932 | 6/1998 | Pan et al. . |
| 5,767,005 | 6/1998 | Doan et al. . |
| 5,892,257 | 4/1999 | Acocella et al. . |
| 6,008,112 | * 12/1999 | Acocella et al. ..................... 438/593 |
| 6,054,733 | 4/2000 | Doan et al. . |

OTHER PUBLICATIONS

William J. Patrick et al., "Application of Chemical Mechanical Polishing to the Fabrication of VLSI Circuit Interconnections", J. Electrochem. Soc., vol. 138, No. 6, Jun. 1991.

Micron Quantum Devices, "Booth Block Flash Memory", technical brochure, 1997.

* cited by examiner

*Primary Examiner*—Richard Booth
(74) *Attorney, Agent, or Firm*—Stephen A. Gratton

(57) ABSTRACT

A method for fabricating floating gate semiconductor devices, such as flash EEPROMs, and flash EEPROM memory arrays, is provided. The method includes providing a semiconductor substrate and forming active areas on the substrate. Each active area includes elements of a field effect transistor (FET) including a source, a drain, a channel region, and a gate dielectric layer. Trench isolation structures are also formed in the substrate for electrically isolating the active areas. In addition, a conductive layer (e.g., polysilicon) is deposited on the active areas, and chemically mechanically planarized to an endpoint of the trench isolation structures to form self aligned floating gates on the active areas. Control gate dielectric layers, and control gates are then formed on the floating gates.

12 Claims, 5 Drawing Sheets

METHOD FOR FABRICATING FLOATING GATE SEMICONDUCTOR DEVICES WITH TRENCH ISOLATION STRUCTURES AND SELF ALIGNED FLOATING GATES

CROSS REFERENCE TO RELATED APPLICATIONS

This application is a division of application Ser. No. 09/148,845, filed on Sep. 4, 1998, which is a continuation-in-part of application Ser. No. 08/909,713, filed Aug. 12, 1997, U.S. Pat. No. 6,054,733, which is a division of application Ser. No. 08/532,997, filed Sep. 25, 1995, U.S. Pat. No. 5,767,005, which is a continuation-in-part of application Ser. No. 08/098,449, filed Jul. 27, 1993, abandoned.

FIELD OF THE INVENTION

This invention relates generally to semiconductor manufacture, and more particularly to an improved method for fabricating floating gate semiconductor devices with trench isolation structures and self aligned floating gates. The method is particularly suited to the formation of non-volatile read only memories, such as flash EEPROMs.

BACKGROUND OF THE INVENTION

Semiconductor memory arrays can be fabricated using floating gates (i.e., unconnected gates) that control current flow through the devices of the array. One type of floating gate device used to construct memory arrays is referred to as a flash EEPROM (electrically erasable programmable read only memory).

A flash EEPROM memory array includes multiple cells that can be erased using a single erasing operation. Typically, a flash EEPROM cell includes a floating gate, that controls current flow through a channel region of a field effect transistor (FET). The floating gate is separated from a source and drain of the FET by a thin gate oxide layer. The flash EEPROM cell also includes an elongated control gate located in a direction transverse to the source and drain of the FET. The control gates can be the word lines, and the sources and drains of the FETs can be the bit lines of the memory array.

In operation of the flash EEPROM cell, the presence of electrons in the floating gate alters the normal operation of the FET, and the flow of electrons between the source and drain of the FET. Programming of the flash EEPROM can be accomplished by hot-electron injection into the floating gate. With one type of EEPROM cell, the erasing mechanism can be electron tunneling off the floating gate to the substrate. In a memory array with this type of EEPROM cell, the individual cells are electrically isolated from one another such that the individual cells can be selectively erased.

Conventional floating gate arrays, such as flash EEPROM arrays, utilize a thermally grown field oxide (FOX) to electrically isolate adjacent cells in the array. One problem with a thermally grown field oxide is that the surface of the field oxide has a non-planar topography. With a non-planar topography, the size and spacing of features on subsequently deposited and patterned layers, such as interconnect layers, is limited by the depth of focus of conventional photolithography exposure tools. This limits the feature sizes of the array.

Another problem with field oxide isolation is that the source and drain regions of the FETs of the array can be degraded due to exposure to temperature cycles during growth of the field oxide. This can cause the source and drain regions to become less efficient in the generation of hot electrons for injection through the gate oxide layer into the floating gate.

Another consideration in the formation of floating gate devices is the alignment of the floating gates relative to other elements of the device. For example, one type of flash EEPROM cell has a floating gate which extends across the channel region of an FET. Alignment of the floating gate to the channel region requires a critical alignment step. Consequently the floating gates of flash EEPROMs have sometimes been made larger than necessary to insure alignment of the floating gates with the channel regions. In addition to alignment, a thickness of the floating gates is a critical dimension that can affect capacitive coupling between the floating gates and the control gates of flash EEPROMs. In the past the thickness of the floating gates has been difficult to control, and the floating gates have been made thicker than necessary.

The present invention is directed to a method for fabricating floating gate devices in which trench isolation, such as shallow trench isolation (STI), rather than a thermally grown field oxide, is used to electrically isolate adjacent cells. In addition, the method employs chemical mechanical planarization (CMP) to self align the floating gates relative to other elements of the devices.

SUMMARY OF THE INVENTION

In accordance with the present invention, a method for fabricating a floating gate semiconductor device, and an improved floating gate semiconductor device, are provided. In an illustrative embodiment the method is used to fabricate a flash EEPROM cell, and a flash EEPROM memory array.

The method, simply stated, comprises: providing a semiconductor substrate; forming active areas in the substrate; forming trench isolation structures on the substrate for isolating the active areas; forming a gate dielectric layer on the active areas; forming floating gates on the gate dielectric layer by chemically mechanically planarizing a blanket deposited conductive layer to an endpoint of the trench isolation structures; and then forming a control gate dielectric layer and control gates on the floating gates.

Initially, a semiconductor substrate (e.g., silicon) can be provided and active areas formed in the substrate. Each active area can include elements of a field effect transistor (e.g., source, drain, channel region). Following formation of the active areas, a sacrificial oxide layer, and a mask layer, can be formed on the substrate. The mask layer can then be patterned using a resist mask, to form a hard mask, which can be used to etch isolation trenches in the substrate.

Next, a trench fill material, such as $SiO_2$, can be deposited into the isolation trenches to form electrically insulating plugs. Following formation, the trench fill material can be removed to an endpoint of the mask layer preferably using chemical mechanical planarization (CMP). The mask layer can then be removed, leaving the trench fill material in each trench. With the mask layer removed, the trench fill material within each trench is higher than a surface of the substrate, such that recesses are formed which at least partially enclose each active area.

Following formation of the trench isolation structures, a gate dielectric layer can be formed on the active areas. In addition, a first conductive layer can be blanket deposited on the gate dielectric layer and partially removed and planarized preferably using CMP, to an endpoint of the trench fill material. The planarized conductive layer partially defines floating gates on the gate dielectric layer which are self aligned to the active areas. Next, a control gate dielectric layer can be deposited on the floating gates and on the trench fill material. A second conductive layer can then be deposited on the control gate dielectric layer and patterned to form control gates. During patterning of the second conductive layer, the planarized conductive layer can also be patterned to complete the floating gates.

The completed memory array includes rows and columns of flash EEPROM cells. Each flash EEPROM cell includes a FET with a source and drain, a gate dielectric layer on the source and drain, a self aligned floating gate on the gate dielectric layer, a control gate dielectric layer on the floating gate, and a control gate on the control gate dielectric layer. Trench isolation structures electrically isolate adjacent cells, and the floating gates of adjacent cells. In addition, the sources and drains of the FETs form the bit lines of the memory array, and the control gates form the word lines of the memory array.

Alternately the control gate dielectric layer can be deposited on the conductive layer prior to the chemical mechanical planarization step. The chemical mechanical planarization step can then be performed to planarize the control gate dielectric layer and the conductive layer.

DETAILED DESCRIPTION OF THE PREFERRED EMBODIMENT

Referring to FIGS. 1A–1G, steps in the method of the invention are illustrated for forming a floating gate device comprising a flash EEPROM cell.

Figure 1A:
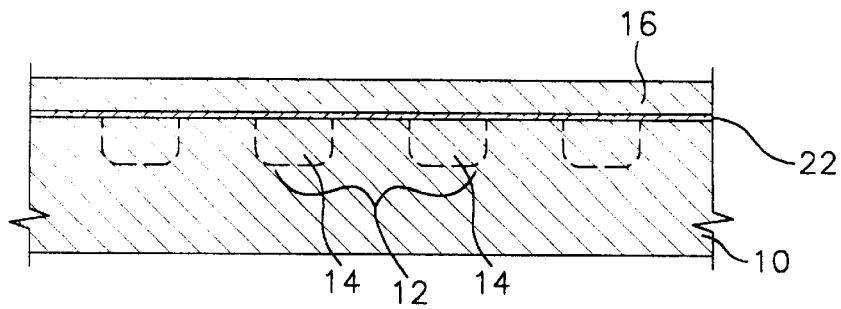
FIGS. 1A–1G are schematic cross sectional views illustrating steps in a method for fabricating a flash EEPROM cell in accordance with the invention.

Initially, as shown in FIG. 1A, a semiconductor substrate 10 can be provided. Preferably, the substrate 10 comprises monocrystalline silicon. The substrate 10 includes a pattern of active areas 12 comprising spaced apart source/drain regions 14. The active areas 12 and source/drain regions 14 can be formed by implanting one or more dopants into the substrate 10 using techniques that are known in the art (e.g., masking and ion implantation).

As also shown in FIG. 1A, a sacrificial oxide layer 22 can be formed on the substrate 10. One suitable material for the sacrificial oxide layer 22 comprises $SiO_2$ deposited using a CVD process with a silicon containing precursor such as TEOS (tetraethyl orthosilicate). A representative thickness for the sacrificial oxide layer 22 can be from 50 Å to 2000 Å.

As also shown in FIG. 1A, a mask layer 16 can be formed on the sacrificial oxide layer 22. One suitable material for the mask layer 16 comprises silicon nitride ($Si_3N_4$) deposited by CVD. A representative thickness for the mask layer 16 can be from 300 Å to 3000 Å.

Figure 1B:
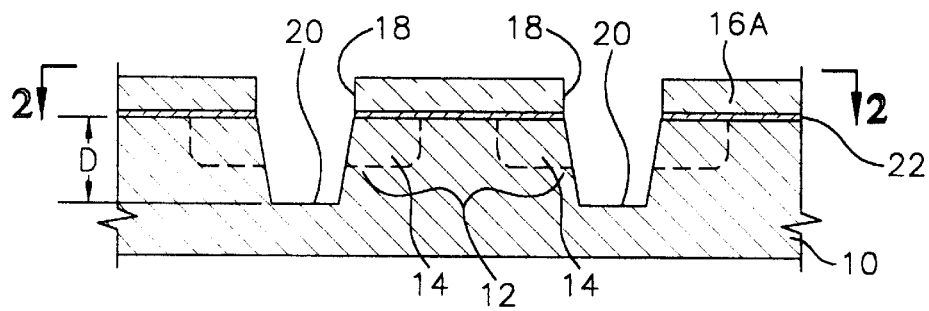

Next as shown in FIG. 1B, the mask layer 16 can be patterned and etched to form a hard mask 16A. A photo patterned layer of resist (not shown) can be used to pattern and etch the mask layer 16 to form the hard mask 16A. The hard mask 16A includes a pattern of openings 18 that are sized and shaped for etching isolation trenches 20 in the substrate 10.

Following formation of the hard mask 16A, the isolation trenches 20 can be etched into the substrate 10 to a desired depth "D". One method for etching the isolation trenches 20 comprises an anisotropic dry etch process, such as reactive ion etching (RIE), using a suitable etchant, such as a species of Cl. In FIG. 1B, the isolation trenches 20 have sloped sidewalls as is consistent with an anisotropic etch process. Rather than dry etching the isolation trenches 20, an isotropic wet etch with a wet etchant can be employed. A suitable wet etchant for a silicon substrate comprises a mixture of HF, $HNO_3$, and $H_2O$.

Figure 2:
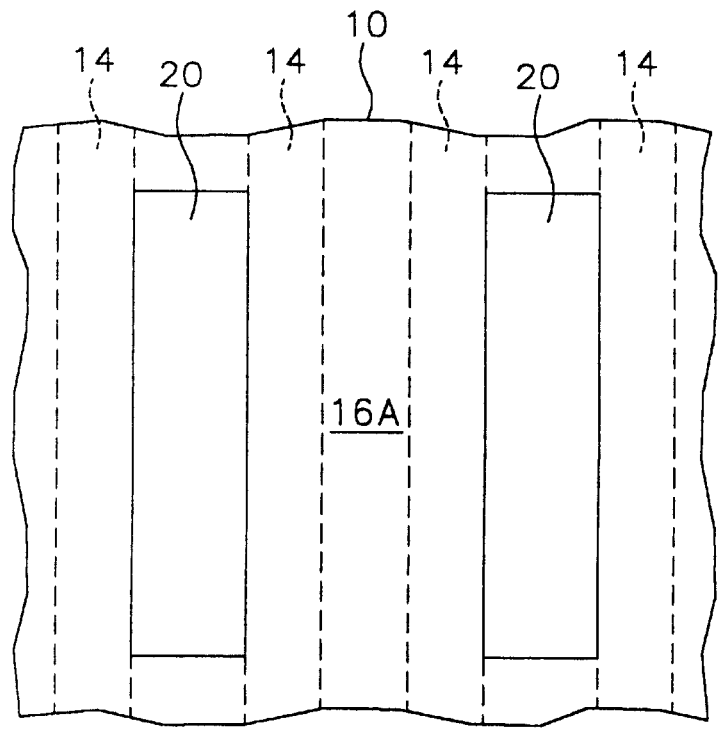
FIG. 2 is a schematic cross sectional view taken along section line 2—2 of FIG. 1B.

The etch process can be controlled to etch the isolation trenches 20 in the substrate 10 to a desired depth D. Preferably, the isolation trenches 20 comprise shallow trenches (i.e., D is less than about 1 μm). However, the isolation trenches 20 can also comprise moderate depth trenches (i.e., D is from about 1 to 3 μm), or deep trenches (i.e., trenches greater than about 3 μm). A peripheral shape and location of the trenches 20 is controlled by a peripheral shape and location of the openings 18 in the hard mask 16A. As shown in FIG. 2, the isolation trenches 20 can be elongated, parallel, spaced rectangles. Alternately the isolation trenches can be any other required shape (e.g., squares, elongated ovals).

Figure 1C:
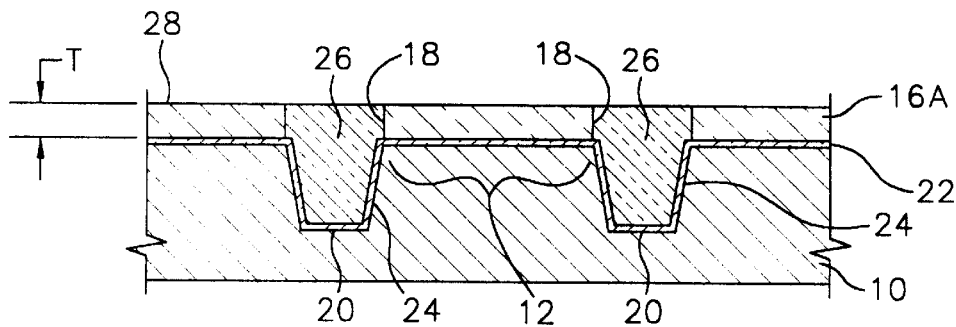

Following etching of the isolation trenches 20, and as shown in FIG. 1C, an insulating layer 24 can be formed within the isolation trenches 20. One suitable material for the insulating layer 24 comprises $SiO_2$ formed using a thermal oxidation process (e.g., heating in an oxygen containing ambient). The insulating layer 24 can remove damage caused by high energy ion bombardment during the trench etching step. In addition, the insulating layer 24 can round sharp corners at the bottoms of the isolation trenches 20. A representative thickness for the insulating layer 24 can be from 50 Å to 1000 Å.

As also shown in FIG. 1C, the isolation trenches 20 can be filled with a trench fill material 26 to form insulating plugs. One suitable material for the insulating layer 24 comprises $SiO_2$ deposited using a CVD process with a silicon containing precursor such as TEOS (tetraethyl orthosilicate). Alternately the trench fill material 26 can comprise BPSG, a nitride or other suitable electrically insulating material. In addition to filling the isolation trenches 20, the trench fill material 26 also fills the openings 18 in the hard mask 16A.

As also shown in FIG. 1C, following deposition thereof, the trench fill material 26 can be planarized to an endpoint of the hard mask 16A using chemical mechanical planarization (CMP). Following the CMP process, a surface 28 of the trench fill material 26 and hard mask 16A are substantially co-planar to one another.

One suitable CMP apparatus for performing the CMP step comprises a Model 372 manufactured by Westech. By way of example, the following parameters can be maintained during the CMP process:

| Pressure | 1 psi to 5 psi |
|---|---|
| Slurry Composition | Silica or Cesium Oxide based |
| Slurry Rate | 1 milliliters per minute to 200 milliliters per minute |
| RPM | 5 to 50 |
| Polishing Pad | Rodel Polytex Supreme |
| Etch Rate | 100 Å to 4000 Å/min. |

Figure 1D:
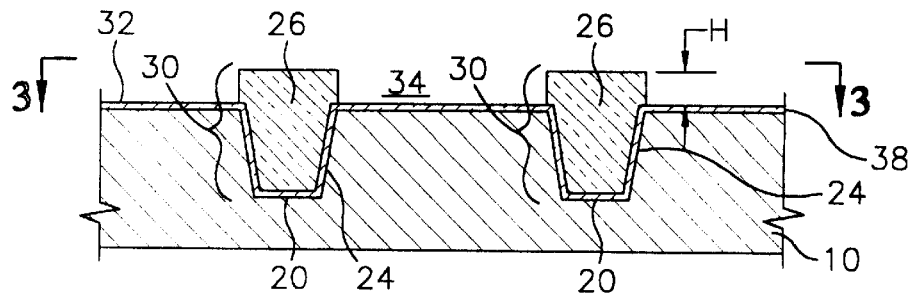

Referring to FIG. 1D, following planarization of the trench fill material 26, the hard mask 16A can be stripped. A hard mask 16A comprised of $Si_3N_4$ can be stripped using a wet etchant, such as $H_3PO_4$.

The sacrificial oxide 22 can also be stripped. For a sacrificial oxide 22 comprised of $SiO_2$, a solution of HF can be used to strip the sacrificial oxide 22. With the sacrificial oxide 22 stripped, a gate dielectric layer 38 can be formed on the substrate 10. For example, the gate dielectric layer 38 can comprise $SiO_2$ having a thickness of about 30 Å to 800 Å and formed using a CVD or thermal growth process. Alternately, instead of $SiO_2$, the gate dielectric layer 38 can comprise a nitride (e.g., $Si_3N_4$), an oxynitride (e.g., NO) or another oxide (e.g., $Ta_2O_5$).

The completed trench isolation structures 30 have a height "H" measured from a surface 32 of the gate dielectric layer 38. Stated differently, the trench isolation structures 30 are higher than the surface 32. In addition, the height "H" is approximately equal to a thickness "T" (FIG. 1C) of the planarized hard mask 16A.

Figure 3:
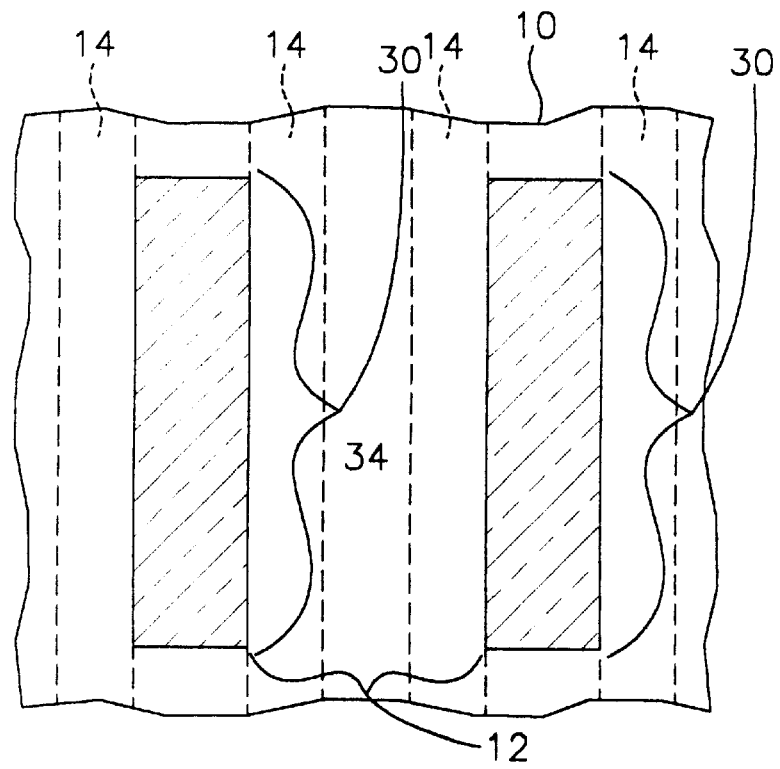
FIG. 3 is a schematic cross sectional view taken along section line 3—3 of FIG. 1D.

As also shown in FIG. 1D, adjacent trench isolation structures 30 form a recess 34. As shown in FIG. 3, the recess 34 at least partially encloses the active area 12 located between adjacent trench isolation structures 30.

Figure 1E:
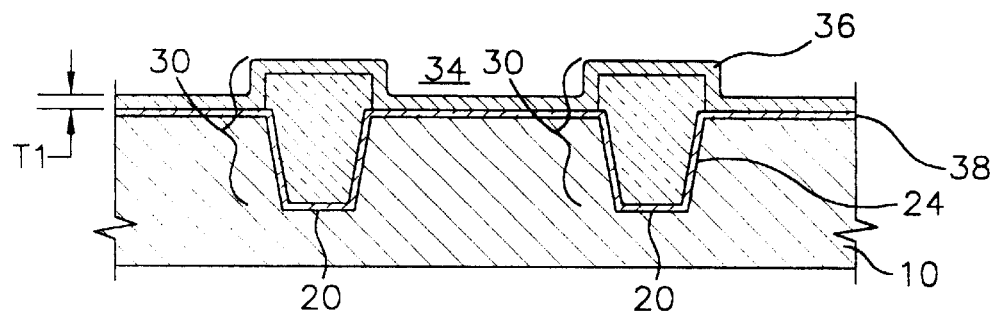

Referring to FIG. 1E, a first conductive layer 36 can be blanket deposited over the gate dielectric layer 38 and over the trench isolation structures 30. In addition, the first conductive layer 36 extends into the recesses 34 defined by the parallel spaced trench isolation structures 30. The first conductive layer 36 can comprise doped polysilicon deposited to a desired thickness using CVD. Alternately, the first conductive layer 36 can comprise a metal such as titanium, tungsten, tantalum, molybdenum or alloys of these metals. Preferably, the first conductive layer 36 has a thickness "T1" that is equal to or less than a height "H" of the trench isolation structures 30.

Figure 1F:
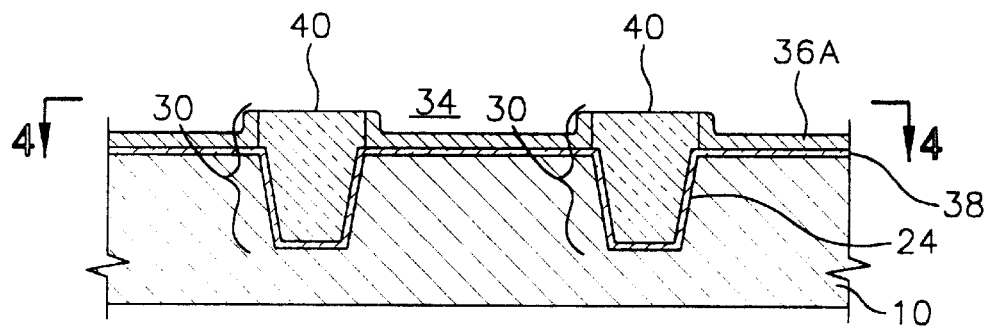
Figure 4:
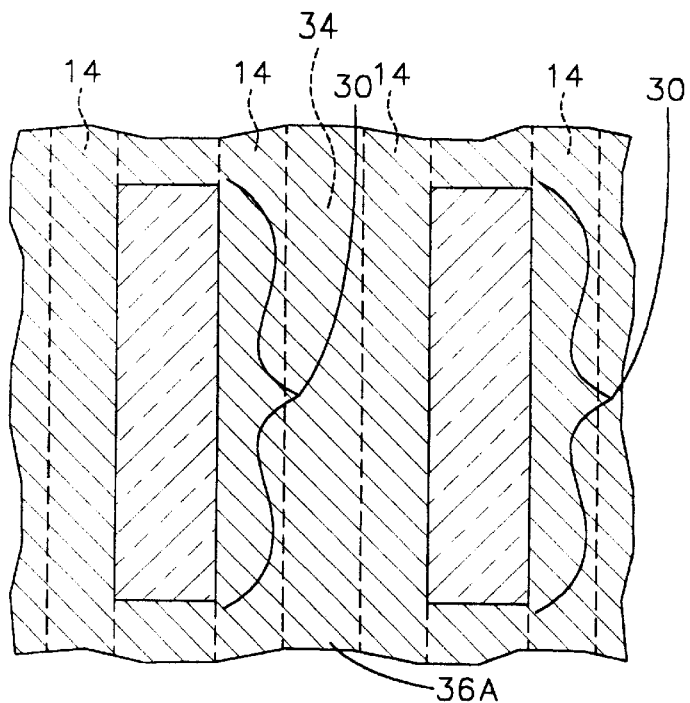
FIG. 4 is a schematic cross sectional view taken along section line 4—4 of FIG. 1F.
Figure 5:
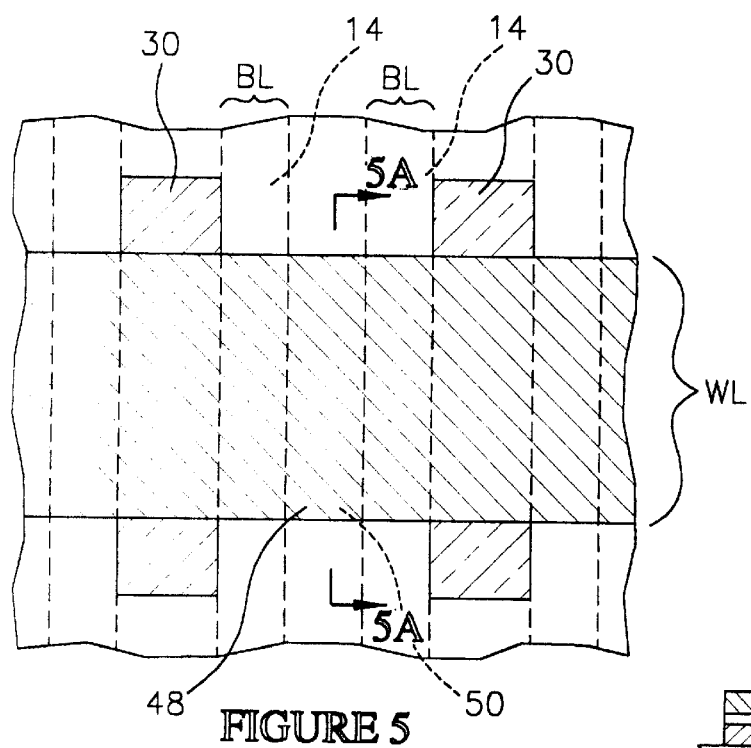
FIG. 5 is a schematic cross sectional view taken along section line 5—5 of FIG. 1G.

Referring to FIG. 1F, following blanket deposition, the first conductive layer 36 can be planarized to an endpoint 40 of the trench isolation structures 30 to form a planarized first conductive layer 36A. As shown in FIG. 4, the planarized first conductive layer 36A substantially covers the recesses 34. In addition, the planarized first conductive layer 36A can be considered as self aligned to the active areas 12 which are located under the recesses 34. However, the first conductive layer 36 has been removed from the trench isolation structures 30. During a patterning step to be subsequently described, the self aligned and planarized first conductive layer 36A will be patterned to form floating gates 50 (FIG. 5).

Planarization of the first conductive layer 36 can be accomplished using a chemical mechanical planarization process, substantially as previously described. Endpoint detection can be accomplished by techniques that are known in the art, such as direct measurement, or approximations based on experimental data, and known process conditions.

Figure 1G:
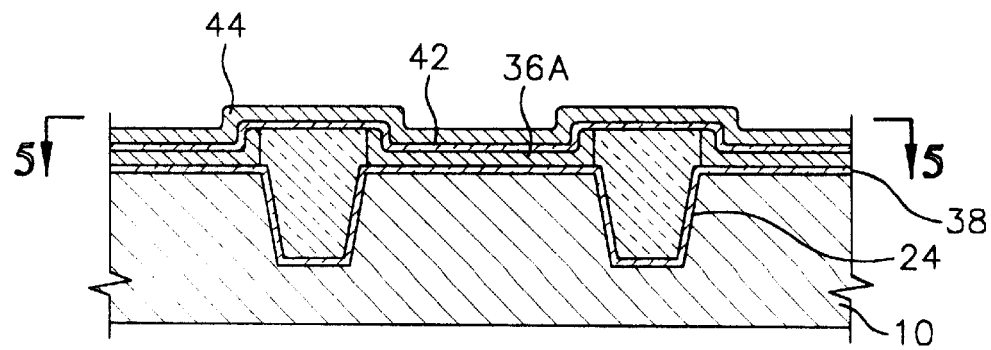

Referring to FIG. 1G, a control gate dielectric layer 42 can be deposited on the planarized first conductive layer 36A. The control gate dielectric layer 42 can comprise $SiO_2$ deposited to a desired thickness using a CVD or thermal growth process as previously described. A representative thickness for the control gate dielectric layer 42 can be from 10 Å to 1000 Å. Alternately, instead of $SiO_2$, the control gate dielectric layer 42 can comprise a nitride (e.g.,$Si_3N_4$), an oxynitride (e.g., NO) or another oxide (e.g., $Ta_2O_5$).

Following formation of the control gate dielectric layer 42, a mask (not shown) can be formed on the substrate 10 for removing unwanted portions of the control gate dielectric layer 42. By way of example, the mask (not shown) can comprise a nitride hard mask as previously described formed using techniques that are known in the art. Open areas of the mask (not shown) can align with peripheral devices of the array that do not require a floating gate. The mask (not shown) can be described as a non-critical mask because satisfactory alignment of the relatively large areas involved can be effected without introducing alignment errors. A suitable wet etchant such as HF can be used to remove unwanted portions of the control gate dielectric layer 42.

Alternately, the control gate dielectric layer 42 can be deposited prior to chemical mechanical planarization of the first conductive layer 36. In this case the control gate dielectric layer 42 would then be chemically mechanically planarized with the first conductive layer 36.

As also shown in FIG. 1G, a second conductive layer 44 can be deposited on the first conductive layer and on the patterned control gate dielectric layer 42. The second conductive layer 44 can comprise polysilicon deposited using a CVD process as previously described. Alternately the second conductive layer 44 can comprise a metal as previously described.

Figure 5A:
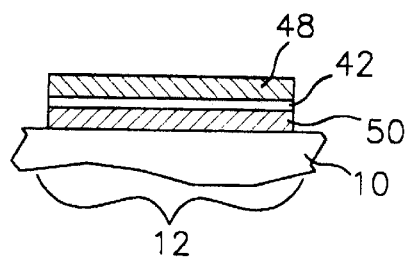
FIG. 5A is a cross sectional view taken along section line 5A—5A of FIG. 5.

Following deposition, the second conductive layer 44 can be patterned and etched to form control gates 48 (FIG. 5) and word lines WL (FIG. 5). At the same time that the second conductive layer 44 is patterned and etched, the planarized first conductive layer 36A can also be patterned and etched to define floating gates 50 (FIG. 5A). A dry etch process using a mask (not shown) and a suitable etching species can be used to etch the control gates 48 and the floating gates 50. As shown in FIG. 5A, the active areas 12 on the substrate 10 include the control gates 48 and the floating gates 50, separated by the control gate dielectric layer 42. Conventional semiconductor processes (i.e., forming interconnect and passivation layers) can now be used to complete the device.

Figure 6:
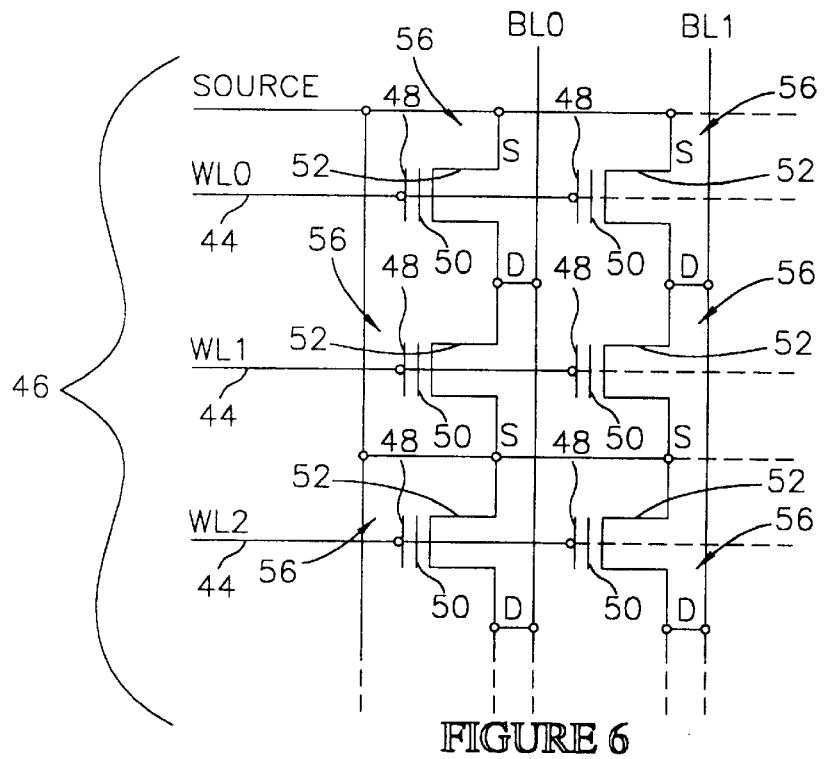
FIG. 6 is an electrical schematic of a flash EEPROM memory array constructed in accordance with the invention.

Referring to FIG. 6, a memory array 46 constructed using the method outlined in FIGS. 1A–1G is illustrated. The memory array 46 includes rows and columns of floating gate cells 56. In the illustrative embodiment, each floating gate cell 56 comprises a flash EEPROM. Each floating gate cell 56 comprises an FET 52 formed by an active area 12 (FIG. 1A) on the substrate 10.

Each FET 52 includes a source "S", and a drain "D", formed by the source/drain regions 14 (FIG. 1A) on the substrate 10. In addition, each FET 52 in the memory array 46 includes a floating gate 50 and a control gate 48. The planarized first conductive layer 36A (FIG. 1F) forms the floating gates 50. The patterned second conductive layer 44 forms the control gates 48 and the word lines (WL0, WL1, WL2 . . . ) of the memory array 46. The sources S and drains D of the FETs 52 form the bit lines (BL0, BL1 . . . ) of the memory array 46.

Figure 7:
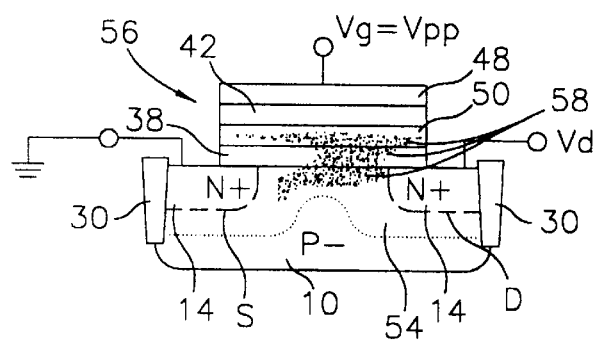
FIG. 7 is a schematic cross sectional view of the flash EEPROM cell during a write operation.
Figure 8:
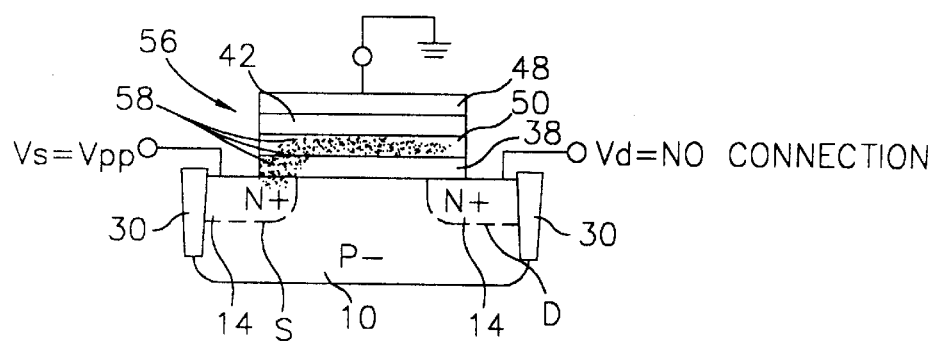
FIG. 8 is a schematic cross sectional view of the flash EEPROM cell during an erase operation.

Referring to FIGS. 7 and 8, operational characteristics of a floating gate cell 56 are illustrated. FIG. 7 illustrates the floating gate cell 56 during a WRITE operation. During a WRITE, a high programming voltage (e.g., $V_{pp}$=12V) is placed on the control gate 48. The high programming voltage forms an inversion region 54 in the substrate 10 which in the illustrative embodiment comprise P-silicon. At the same time the drain voltage ($V_D$) is increased to about half the programming voltage (e.g., $V_D$=0.5 $V_{pp}$=6V), while the source is grounded (0 volts). With the inversion region 54 formed, the current between the drain D and source S increases. The resulting high electron flow from source S to drain D increases the kinetic energy of electrons 58. This causes the electrons 58 to gain enough energy to cross the gate dielectric layer 38 and collect on the floating gate 50.

After the WRITE is completed, the negative charge on the floating gate 50 raises the cell's threshold voltage ($V_T$) above the word line logic 1 voltage. When a written cell's word line is brought to a logic 1 during a READ, the cell will not turn on. Sense amps (not shown) associated with the memory array 46 amplify the cell current and output a 0 for a written cell.

FIG. 8 illustrates the floating gate cell 56 during an ERASE operation. In this mode Fowler-Nordheim tunneling removes charge from the floating gate 50 to bring it to the erased state. Using a high-voltage source erase, the source is brought to a high voltage ($V_{pp}$=12V), the control gate 48 is grounded (0 volt) and the drain D is left unconnected. The large positive voltage on the source, as compared to the floating gate 50, attracts the negatively charged electrons from the floating gate 50 though the gate dielectric layer 38 to the source. Because the drain D is not connected, the ERASE function is a much lower current per cell operation than a WRITE that uses hot electron injection.

After the ERASE is completed, the lack of charge on the floating gate 50 lowers the cells $V_T$ below the word line logic 1 voltage. When an erased cell's word line is brought to a logic 1 during a READ, the FET 56 will turn on and conduct more current than a written cell.

During a READ of a byte or word of data, the addressed row (word line) is brought to a logic 1 level (>$V_T$ of an erased cell). This condition turns on erased cells which allow current to flow from drain D to source S, while written cells remain in the off state with little current flow from drain D to source S. The cell current is detected by the sense amps and amplified to the appropriate logic level to the outputs.

Thus the invention provides an improved method for fabricating floating gage semiconductor devices such as flash EEPROMs and flash EEPROM memory arrays. The invention also provides improved floating gate semiconductor devices, and improved memory arrays.

Although the invention has been described with reference to certain preferred embodiments, as will be apparent to those skilled in the art, certain changes and modifications can be made without departing from the scope of the invention as defined by the following claims.

I claim:

1. A floating gate semiconductor device comprising:
    a semiconductor substrate having a surface;
    an active area on the substrate comprising spaced source/drain regions on opposing sides thereof;
    a pair of spaced isolation structures in the substrate electrically isolating the active area, each isolation structure located on a side of the active area proximate to a source/drain region and configured to electrically insulate the active area from adjacent active areas on the substrate, the pair of spaced isolation structures having endpoints with a height relative to the surface forming a recess at least partially enclosing the active area;
    a first dielectric layer on the active area;
    a conductive layer within the recess and on the first dielectric layer, the conductive layer planarized to the endpoints and configured as a floating gate;
    a second dielectric layer on the conductive layer; and
    a second conductive layer on the second dielectric layer configured as a control gate.

2. The semiconductor device of claim 1 wherein the isolation structures comprise a chemically mechanically planarized oxide.

3. The semiconductor device of claim 1 wherein the isolation structures comprise $SiO_2$.

4. A floating gate semiconductor device comprising:
    a semiconductor substrate having a surface;
    a field effect transistor on the substrate comprising a gate dielectric layer and spaced source/drain regions on opposing sides thereof;
    a pair of spaced isolation structures in the substrate electrically isolating the field effect transistor from adjacent field effect transistors on the substrate, each isolation structure located on a side of the transistor proximate to a source/drain region, the pair of spaced isolation structures comprising an electrically insulating material configured to form a recess at least partially enclosing the transistor and having endpoints with a height relative to the surface;

a floating gate on the gate dielectric layer comprising a conductive layer within the recess planarized to the endpoints of the isolation structures;

a control gate dielectric layer on the floating gate; and a control gate on the control gate dielectric layer.

5. The semiconductor device of claim 4 wherein the transistor comprises a source and a drain and the floating gate covers the source and the drain.

6. The semiconductor device of claim 4 wherein the device is contained in a memory with a plurality of floating gate devices.

7. The semiconductor device of claim 4 wherein the device comprises a flash EEPROM.

8. A semiconductor array comprising:

a semiconductor substrate having a surface;

a plurality of active areas on the substrate, each active area comprising spaced source/drain regions on opposing sides thereof;

a plurality of electrically insulating isolation structures in the substrate electrically insulating the active areas from one another, each isolation structure located on a side of an active area proximate to a source/drain region forming a plurality of recesses at least partially enclosing the active areas and having endpoints with a height relative to the surface; and a plurality of floating gates on the substrate comprising conductive layers within the recesses planarized to the endpoints of the isolation structures.

9. The semiconductor array of claim 8 further comprising a plurality of control gates separated from the floating gates by a first dielectric layer.

10. The semiconductor array of claim 8 further comprising a second dielectric layer on the substrate separating the floating gates from the substrate.

11. A semiconductor array comprising:

a semiconductor substrate comprising a gate dielectric layer;

a plurality of field effect transistors on the substrate comprising sources and drains electrically connected to form bit lines, each transistor comprising a source/drain region on opposing sides thereof;

a plurality of isolation structures in the substrate configured to electrically insulate the transistors from one another, each isolation structure located on a side of a transistor, the isolation structures comprising an electrically insulating material having a height with respect to the gate dielectric layer and forming a plurality of recesses at least partially enclosing the transistors;

a plurality of floating gates within the recesses comprising a plurality of conductive layers planarized to endpoints of the isolation structures;

a plurality of control gate dielectric layers on the floating gates; and a plurality of control gates on the control gate dielectric layers and configured as word lines.

12. The semiconductor array of claim 11 wherein the array comprises a flash EEPROM memory array.

* * * * *